US012792805B2

(12) United States Patent
Gandhi et al.

(10) Patent No.: US 12,792,805 B2
(45) Date of Patent: Nov. 10, 2026

(54) METHOD FOR COMPREHENSIVE LOW POWER SIMULATION COVERAGE

(71) Applicant: TEXAS INSTRUMENTS INCORPORATED, Dallas, TX (US)

(72) Inventors: Vivek Gandhi, Bangalore (IN); Venkatraman Ramakrishnan, Bangalore (IN); Lakshmanan Balasubramanian, Bangalore (IN); Harsh Kumar Sharma, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 786 days.

(21) Appl. No.: 18/315,076

(22) Filed: May 10, 2023

(65) Prior Publication Data

US 2023/0367938 A1 Nov. 16, 2023

(30) Foreign Application Priority Data

May 10, 2022 (IN) ............................ 202241026922

(51) Int. Cl.
*G06F 30/333* (2020.01)
*G06F 30/3308* (2020.01)

(52) U.S. Cl.
CPC ........ *G06F 30/333* (2020.01); *G06F 30/3308* (2020.01)

(58) Field of Classification Search
USPC ........................................................ 716/106
See application file for complete search history.

(56) References Cited

U.S. PATENT DOCUMENTS

| | | | | |
|---|---|---|---|---|
| 10,503,243 | B1 * | 12/2019 | Beletsky | G06F 1/3287 |
| 11,574,099 | B2 | 2/2023 | Balasubramanian et al. | |
| 2017/0228481 | A1 * | 8/2017 | Pusuluri | G06F 30/392 |
| 2021/0255682 | A1 | 8/2021 | Balasubramanian et al. | |

OTHER PUBLICATIONS

U.S. Appl. No. 17/899,252, filed Aug. 30, 2022, entitled "'Weak' Undriven State Modelling for Power Management Verification," listing Balasubramanian et al. as inventors.

* cited by examiner

*Primary Examiner* — Bryce M Aisaka
(74) *Attorney, Agent, or Firm* — Carl G. Peterson; Charles F. Koch

(57) ABSTRACT

A method comprises creating an electronic module design having a plurality of electronic components comprising a plurality of low power enabled components and defining a model of functional behavior and of power behavior. The method also comprises identifying sequential element information correlated with an electronic component based on the models of functional and power behavior. the sequential element information comprising a first control signal and a second control signal. A coverage test is generated based on the sequential element information and is configured to quantify behavior of the electronic component based on a relationship of a plurality of activation states of a first control signal to a plurality of activation states of a second control signal. A simulation file is run to simulate operation of the electronic module design, and a performance status of the electronic module design is determined in response to running the simulation file.

20 Claims, 8 Drawing Sheets

500

```
@ Every retention (RET) or reset (RST) control signal change
    For each Register {

        . . .
        If RET is inactive {
501         If RST is active {
                Set CW_RST coverage; }
                Check for reset value correctness;}

        };
        If RET is active {
            Track PD signal change to inactive;
502         Track PD signal change to active;
            Track subsequent RET change to inactive;
            If PD changed to inactive and active between RET active and inactive {
                Set RET coverage; }

        };
        If RET is active {
            Store Q value;
            Track PD signal change to inactive;
            Track PD signal change to active;
503         Track subsequent RET change to inactive;
            If PD changed to inactive and active between RET active and inactive AND RST is
               inactive when RET changes to inactive {
                   If Q=0 or Q=1 was stored and restored {
                      Set LPM_RET0 or LPM_RET1 coverage; }}

        };
        If RET is active {
            Store Q value;
            Track subsequent RET change to inactive;
504         If RST is active when RET changes to inactive {
        };         If reset value enforced {
                      Set LPM_RST coverage; }}
};
```

FIG. 5

600

```
@ Every Isolation control signal (ISO) change
    For each Register {

        . . .
        If ISO is inactive {
601         If RST is active {
                Set CW_RST coverage; }
                Check for reset value correctness;}

        };
        If ISO is active {
            Track PD signal change to inactive;
602         Track PD signal change to active;
            Track subsequent ISO change to inactive;
            If PD changed to inactive and active between ISO active and inactive {
                Set ISO coverage; }

        };
        If ISO is active (for LATCH type) {
            Store Q value;
            Track PD signal change to inactive;
            Track PD signal change to active;
603         Track subsequent ISO change to inactive;
            If PD changed to inactive and active between ISO active and inactive AND RST is
              inactive when ISO changes to inactive {
                 If Q=0 or Q=1 was stored and restored {
                     Set LPM_ISO0 or LPM_ISO1 coverage; }}

        };
        If ISO is active (for LATCH type) {
            Store Q value;
            Track subsequent ISO change to inactive;
604         If RST is active when ISO changes to inactive {
                 If reset value enforced {
                     Set LPM_RST coverage; }}

        };

};
```

FIG. 6

METHOD FOR COMPREHENSIVE LOW POWER SIMULATION COVERAGE

CROSS-REFERENCE TO RELATED APPLICATION

This application hereby claims the benefit of and priority to Indian Provisional Patent Application Number 202241026922, filed May 10, 2022, entitled "Method For Comprehensive Low Power Simulation Coverage", and which is hereby incorporated by reference in its entirety.

BACKGROUND

In electronic design, a semiconductor intellectual property ("IP") core (often referred to as an "IP core," or "IP block") references a reusable unit of logic, cell, or integrated circuit (commonly called a "chip") layout and design. It gets its name because it may refer to information that is the legal Intellectual Property of a particular party. In the context of this disclosure, IP will refer to the logic and/or metadata associated with design specifications of a chip or System on a Chip ("SoC"). Modern circuit design often involves electronic design automation (EDA) tools to simulate and verify circuit block operation and interconnections. Third-party EDA tool vendors provide services such as the generation of simulation files including executable simulator software for the simulation of circuit block operation and interconnection verification.

Generation of the EDA tool simulation files may quantify coverage for low power aspects like isolation and retention using skeletal or more primitive methodology and flows during the pre-implementation stage using synthesizable design intent in, but not limited to, register transfer logic (RTL) abstraction. For example, only toggle coverage of the isolation control and retention control enable signals is typically available for validation. Accordingly, all possible retention and register states that are relevant in the low power context are not covered in RTL stage low power simulation coverage quantification.

Useful elements such as power state qualification and isolation, level shifting and retention schemes that go beyond just those driven by appropriate control signals are manually identified with current technology, and functional coverage models for each of these are manually developed and exercised in the context of system low power states and functionality. Hence the low power design aspects mature quite late into the system-on-chip (SoC) design cycle that may lead to quality gaps during the design stage and to the late finding of design and architectural issues.

SUMMARY

In accordance with one aspect, a method comprises creating an electronic module design having a plurality of electronic components comprising a plurality of low power enabled components, defining a model of functional behavior based on the electronic module design, and defining a model of power behavior based on the electronic module design. The method also comprises identifying sequential element information correlated with an electronic component of the plurality of electronic components based on both of the model of functional behavior and the model of power behavior, the sequential element information comprising a first control signal and a second control signal. The method further comprises generating a coverage test based on the sequential element information, the coverage test configured to quantify behavior of the electronic component based on a relationship of a plurality of activation states of the first control signal to a plurality of activation states of the second control signal, generating a simulation file based on the model of functional behavior, the model of power behavior, and the coverage test, running the simulation file to simulate operation of the electronic module design, and determining a performance status of the electronic module design in response to running the simulation file.

In accordance with another aspect, a method comprises creating an electronic module design comprising a low power enabled component, generating models of functional and power behavior based on the electronic module design, and identifying information correlated with a low power enabled component based on the models of functional and power behavior. The low power enabled component comprises a first signal input and a second signal input. The method further comprises generating a coverage test based on the identified information, the coverage test configured to evaluate an activation state of a first control signal provided to the first input in relation to an activation state of a second control signal provided to the second signal input at one or more relative time points within the coverage test, generating a simulation file based on the models of functional and power behavior and the coverage test, running the simulation file to simulate operation of the electronic module design, and determining a coverage status of the electronic module design in response to running the simulation file.

BRIEF DESCRIPTION OF THE DRAWINGS

In the drawings:

FIG. 5 is an example of a portion of a coverage rule file according to one or more disclosed implementations.

FIG. 6 is an example of another portion of the coverage rule file according to one or more disclosed implementations.

DETAILED DESCRIPTION

Figure 1:
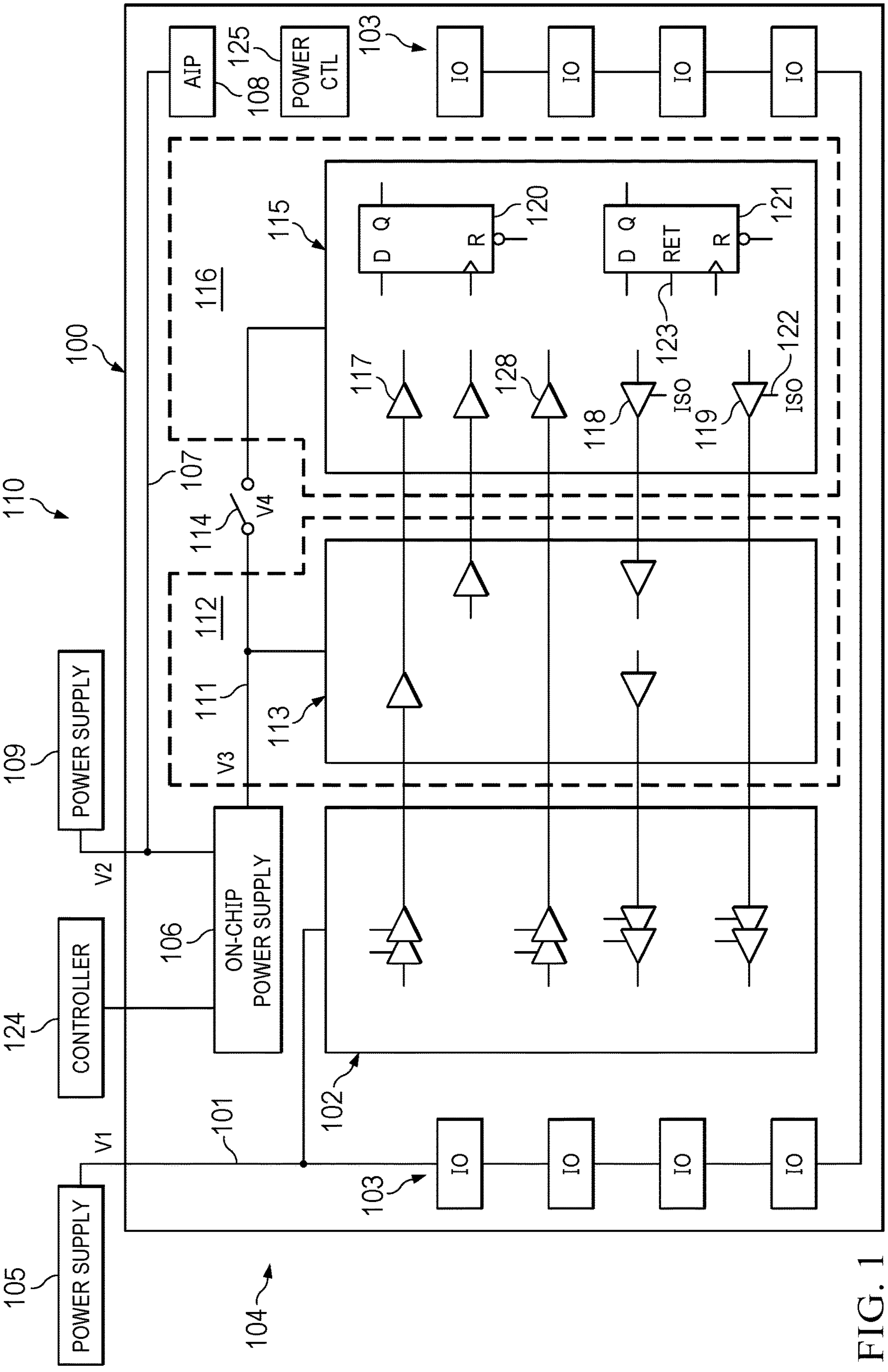
FIG. 1 is an example block diagram of a portion of an SoC according to one or more disclosed implementations.

In the following description, for purposes of explanation, numerous specific details are set forth in order to provide a thorough understanding of the examples disclosed herein. It will be apparent, however, to one skilled in the art that the disclosed example implementations may be practiced without these specific details. In other instances, structure and devices are shown in block diagram form in order to avoid obscuring the disclosed examples. Moreover, the language used in this disclosure has been principally selected for readability and instructional purposes and may not have been selected to delineate or circumscribe the inventive subject matter, resorting to the claims being necessary to determine such inventive subject matter. Reference in the specification to "one example" or to "an example" means that a particular feature, structure, or characteristic described in connection with the examples is included in at least one implementation.

As used herein, the term "medium" refers to one or more non-transitory physical media that together store the contents described as being stored thereon. Examples may include non-volatile secondary storage, read-only memory (ROM), and/or random-access memory (RAM).

As used herein, the term "application" refers to one or more computing modules, programs, processes, workloads, threads and/or a set of computing instructions executed by a computing system. Example implementations of applications and functions include software modules, software objects, software instances and/or other types of executable code.

Aspects of this disclosure apply to both low power components and non-low power components. Low power components are those that operate at lower power consumption under specified special circumstances as can be realized in a special mode of operation enabled by a set of one or more associated control signals. The low power operation to reduce power consumption can be implemented as power gating, for example, where the voltage supplied to a first portion of the low power component is turned or shut off (e.g., using a power switch) while having the voltage supplied to a second portion thereof maintained. Isolation and state retention may be additionally implemented to maintain functional and/or reliability aspects of the low power component during power gating operation and to allow restoration of the low power component to an intended state with fewer overheads when the power supply to the first portion is subsequently restored. Low power operation can further include static or dynamic voltage scaling or biasing including using on-chip supplies where the supply voltage of a first portion of the low power component is scaled down to a different level (e.g., to a lower level such as in the CMOS circuit design context) while having the voltage supplied to a second portion thereof maintained. Level shifting between the two portions operating at different supply voltage levels may be additionally implemented to maintain functional and/or reliability aspects of the low power component during supply scaling. Low power operation may also include dynamic frequency scaling where the frequency of the clock supplied to the first portion of the low power component is scaled down to a lower frequency or clock gating where the clock is completely stopped while having the clock supplied to a second portion thereof maintained at the nominal or higher frequency of operation. Non-low power components are those that operate without simultaneous multiple power levels. Instead, the entire component is turned off or turned on as needed. Simulation of each of the low power and non-low power components is improved via aspects of this disclosure.

FIG. 1 illustrates a block diagram of an SoC 100 according to one or more implementations. A typical SoC comprises multiple hardware components, including, but not limited to:

- a microcontroller, a microprocessor, a digital signal processor (DSP), or multiprocessor SoCs (MPSoC) having more than one processor core;
- memory blocks including a selection of ROM, RAM, EEPROM, and flash memory;
- timing sources including oscillators and phase-locked loops;
- peripherals including counter-timers, real-time timers, and power-on reset generators;
- external interfaces including industry standards such as USB, FireWire, Ethernet, USART, and SPI;
- analog interfaces including ADCs and DACs; and
- voltage regulators and power management circuits.

The above listing of hardware elements is not exhaustive. For simplicity, only a portion of the possible components that may be implemented in an entire SoC design are shown and discussed herein. The SoC 100 is a power managed system and includes a main power supply bus 101 supplying power to a first IP block 102, to a plurality of input/output ("I/O") ports 103 arranged to communicate data into and out of the SoC 100. The connections of the first IP block 102 and the I/O ports 103 to the main power supply bus 101 forms a first power island 104. As illustrated in FIG. 1, the main power supply bus 101 inputs power from a power supply 105 outside of or external to the SoC 100. In other implementations, however, the SoC 100 may include an on-chip main power supply (not shown) providing the power to the main power supply bus 101.

An on-chip supply 106 illustrated in FIG. 1 communicates with a secondary main power supply bus 107 that also provides power to an analog IP (AIP) block 108. As shown, a second power supply 109 provides power to the secondary main power supply bus 107. In another example, the on-chip supply 106 and AIP block 108 may be configured to receive power from the main power supply bus 101. The connections of the on-chip supply 106 and the AIP block 108 to the secondary main power supply bus 107 forms a second power island 110. The on-chip supply 106 provides power to an auxiliary power supply bus 111. The on-chip supply 106 is configured to supply a voltage at a different value than the voltage supplied by the secondary main power supply bus 107. Accordingly, an auxiliary power island 112 is formed separate from the first power island 104. In one example, the voltage supplied by the main power supply bus 101 and the secondary main power supply bus 107 may be 3 V while the voltage supplied by the auxiliary power supply bus 111 may be higher or lower than 3 V (e.g., 1.2 V). The on-chip supply 106 may further deliver some of its power off the SoC 100 to external components. As illustrated, the auxiliary power island 112 includes a second IP block 113 within the SoC design.

Including components capable of going into a low power state in the design of the SoC 100 can yield a savings in power usage during periods in which the operation of these components at full power is not required. As illustrated in FIG. 1, a power switch 114 is serially coupled between the auxiliary power supply bus 111 and a third IP block 115. During certain portions of the operation of the SoC 100, maintaining the supply of power from the auxiliary power supply bus 111 to the entire third IP block 115 may not be needed due, for example, to operations of the SoC 100 involving other areas or components of the SoC 100. During these periods of operation, power usage can be reduced by turning off those portions of the SoC 100 not involved in the current operations. In the implementation shown in FIG. 1, the third IP block 115 is set up to have its power supply from the auxiliary power supply bus 111 turned off via the power switch 114. In this manner, a second auxiliary power island 116 is formed.

The third IP block 115 includes a plurality of components such as input components 117, output components 118-119, a first flip-flop 120, and a second flip-flop 121. The input components 117 and the standard flip-flop 120 illustrate those components of the third IP block 115 in a non-low power category that are completely disabled when the power from the auxiliary power supply bus 111 is turned off to the third IP block 115 during a power save mode. That is, when the power switch 114 is in an open state, the components in the non-low power category completely turn off and consume no power during the power save mode. Turning these non-low power category components off during the power save mode is possible because their operation during the power save mode is not needed in the operations performed by the SoC 100 using other parts of the SoC design. Further, the operating state of these non-low power category components at the time of shut off is not important to the startup of the third IP block 115 when the supply voltage is re-established.

In contrast, the output components 118, 119 and the low power flip-flop 121 belong to the low power category of components. The low power category components can help reduce power consumption during the power save mode by having a portion thereof turned off by the power switch 114. However, shutting off power to the entire component in the low power category can reduce or even be counter-productive to the power consumption minimizing efforts attempted during the power save mode and may also result in unexpected erroneous functional behavior. That is, due to the construction of the low power category components, a higher usage of power may be realized by turning off the power supply to these components during the power save mode compared with the power used by leaving these components in a fully on state. This higher usage of power is usually realized in the rest of the SoC whose power supply remains on and interacts with such output components 118, 119 and 121. Beneficially, leaving the power supplied to a portion of these components while shutting the power off to the rest of these components contributes to power consumption minimization efforts.

As an example of a first low power component, the output components 118, 119 represent isolation cells isolating the outputs of the third IP block 115 from the first IP block 102 or the second IP block 113 during the power save mode. By supplying power to a small portion of the isolation cells 118 and 119 and activating or asserting an isolation control pin 122 during the power save mode, the isolation cells operate to isolate the third IP block 115 from the first IP block 102 or the second IP block 113 when the supply of the power from the auxiliary power supply bus 111 is turned off.

Another example of a low power component includes the low power state retention flip-flop 121. By supplying power to a portion of the low power flip-flop 121 and activating or asserting a retention control pin RET 123 during the power save mode, its output state at the time of the power shut off or at the activation or assertion of the retention control pin RET 123 can be saved to be restored in response to re-supplying the power from the auxiliary power supply bus 111 and inactivation or de-assertion of the retention control pin RET 123 after the power save mode. By saving the current state of the flip-flop prior to turning off its supply power, restoration of the saved state can be quicker than re-establishing its state through other means such as by accessing memory storage and re-setting the state of the flip-flop therefrom. Accordingly, power usage that would be used to re-set the state by accessing memory storage can also be avoided.

Figure 2A:
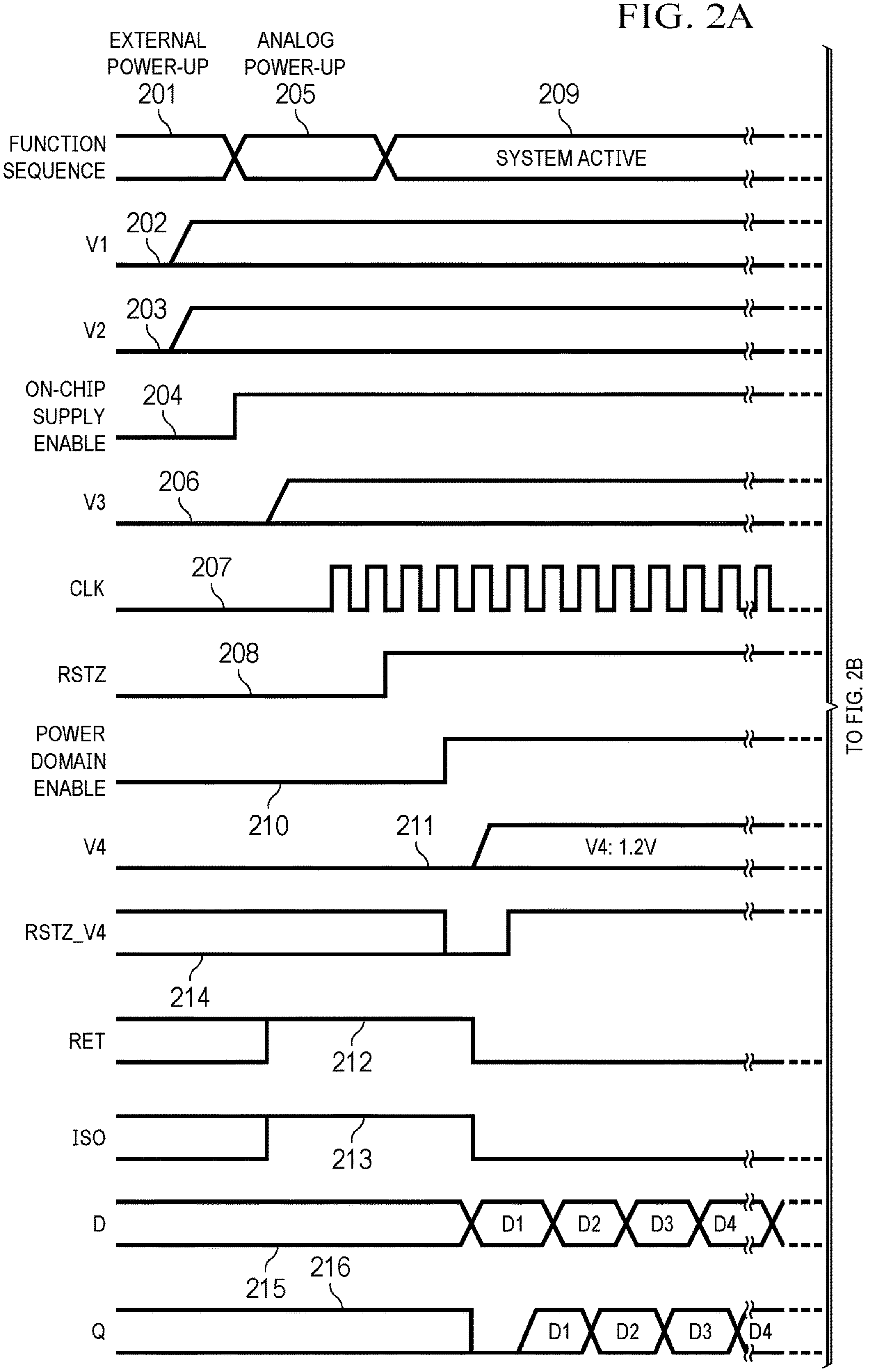
FIG. 2 is an example interface functional waveform of the SoC of FIG. 1 according to one or more disclosed implementations.
Figure 2B:
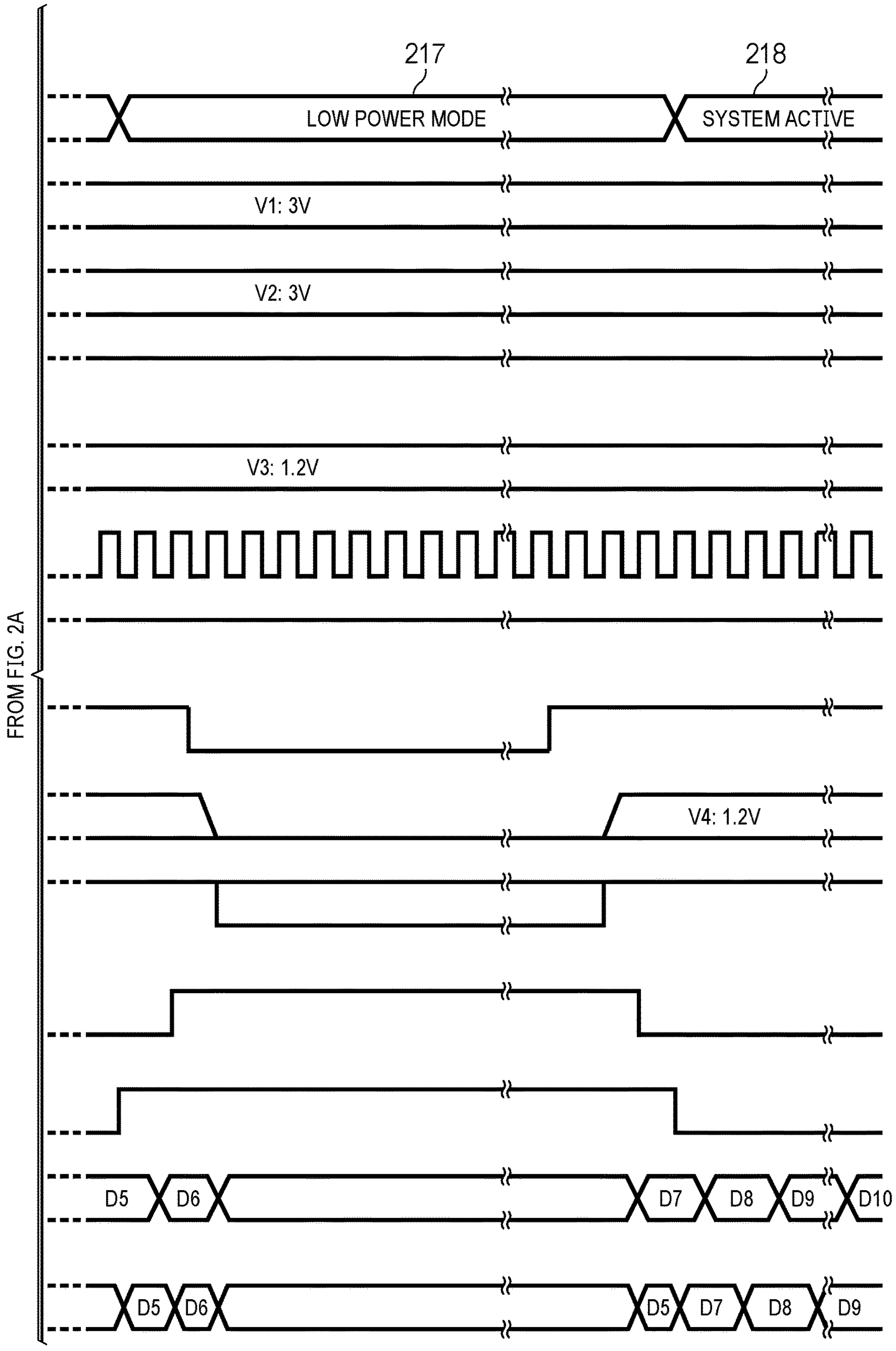

FIG. 2 illustrates an interface functional waveform 200 showing waveforms of a system operation time sequence of the SoC 100 of FIG. 1 according to an example. Referring to FIGS. 1 and 2, an external power-up phase 201 of the system operation includes receiving power to the main power supply bus 101 via power signal V1 202 and the secondary main power supply bus 107 via power signal V2 203 from external power supplies 105 and 109, respectively. As illustrated, voltages of 3 volts are supplied to the SoC 100 as an example of the voltage level required for the first and second power islands 104, 110. However, other voltage levels may be supplied by the external power supplies based on the power needs of the SoC 100. An on-chip supply enable control signal 204 is provided to the SoC 100 from an external controller such as controller 124 or from an on-chip controller such as in a power control block 125. Activation of the on-chip supply enable control signal 204 begins implementation of an analog power-up phase 205 during which the on-chip supply 106 is controlled into an active state to begin supplying power to the auxiliary power supply bus 111. As illustrated, an auxiliary voltage (V3) 206 of 1.2 volts is supplied to the auxiliary power supply bus 111 as an example. On-chip oscillators, such as oscillators within the AIP block 108, receive the auxiliary bus power and start oscillating at a stable frequency to provide a chip clock signal (CLK) 207. An on-chip reset control signal (RSTZ) 208 that starts at an activated or asserted state (e.g., a logic low level) gets inactivated or de-asserted (e.g., a logic high level) in response to stabilization of the auxiliary voltage (V3) 206 of the on-chip supply 106 and stabilization of the frequency of the on-chip clock signal (CLK) 207. State elements on the SoC 100 such as those part of the first, second, and third IP blocks 102, 113, 115 that were kept in their reset conditions while the on-chip reset control signal 208 was active get released from their reset conditions with the inactivation or de-assertion of the on-chip reset control signal 208. Following the inactivation or de-assertion of the on-chip reset control signal 208, a system active phase 209 begins operation.

The system active phase 209 may describe system operations where the components of the entire SoC 100 are powered-up and operating as prescribed including all of the IP blocks (e.g., first, second, and third IP blocks 102, 113, 115). The third IP block 115 may be supplied with power as illustrated in FIG. 2 by activating or asserting (e.g., to a logic high level) a power domain enable control signal 210 to control the power switch 114 into a conduction mode to provide the power from the on-chip supply 106 to the third IP block 115. As a result, an auxiliary voltage (V4) 211 of 1.2 volts is supplied from the auxiliary power supply bus 111 to the second auxiliary power island 116.

While the second auxiliary power island 116 is not in a low power mode during the system active phase 209, low power mode signals (e.g., retention control enable signal 212 and isolation control signal 213) are inactivated or de-asserted (e.g., to a logic low level), and a reset control signal (RSTZ_V4) 214 providing a master reset control signal to the state element components (e.g., low power flip-flop 121 and non-low power flip-flop 120) of the third IP block 115 is inactivated or de-asserted (e.g., a logic high level) to enable the third IP block components to operate as designed. Operation signals of one low power flip-flop component 121, which operates according to a typical D flip-flop when active, are illustrated in FIG. 2 as an example. An input signal (D) 215 is provided to the D input of the low power D flip-flop 121. A resulting output signal (Q) 216 is illustrated of the Q output of the flip-flop 121. As shown, a first D input, D1, is provided to the flip-flop 121, and as a result of the next active clock edge from the clock signal 207, the value of D1 is provided at the Q output of the flip-flop 121. Similar results are achieved at each subsequent input signal 215. When a high signal is input on the data input D during an active clock edge and in response to an inactivated or de-asserted reset input (e.g., a high signal via the reset control signal 214), a high output is produced on the data output Q after a short internal delay. When a low signal is input on the data input D during an active clock edge, a low output is produced on the data output Q after a short internal delay. While portions of the flip-flop illustrated in FIG. 2 are designed to operate as a typical D flip-flop during the system active phase 209, the flip-flop is a low power component capable of low power operation including state retention functionality during a power save mode such as during a low power mode phase 217.

During one or more time periods, the functionality of the third IP block 115 may not be needed for the SoC 100 to perform operational tasks. Accordingly, power may be saved by reducing power supplied to non-used portions of the SoC 100. As an example, the components of the third IP block 115 may not be needed for a time, and thus, power may be saved by putting the third IP block 115 into a low power mode during the low power mode phase 217. While the third IP block 115 may not be needed during the low power mode phase 217, it is beneficial to retain the states of the components for faster restoration of the third IP block 115 to the active state after the low power mode phase 217.

As described above, the isolation cells 118, 119 isolate the outputs of the third IP block 115 to the first IP block 102 or the second IP block 113 during a power save mode (e.g., the low power mode phase 217) by supplying power to a small portion of the isolation cells 118 and 119 and activating or asserting the isolation control pin 122. By supplying power to a portion of the low power flip-flop 121 and activating or asserting the retention control pin RET 123 during the power save mode or low power mode, its output state at the activation or assertion of the retention control pin RET 123 can be saved to be later restored after termination of the power save mode. Accordingly, the low power mode phase 217 may be entered into by activating or asserting the isolation control signal 213 followed by activating or asserting the retention control enable signal 212. In response to the activation or assertion of the retention control enable signal 212, the current output signal 216 (D5) is saved for later restoration in response to bringing the third IP block 115 out of the power save mode. In one example, even though the retention control enable signal 212 is activated or asserted and the value D5 is saved, a subsequent clock pulse may cause the low power flip-flop 121 to at least temporarily output a different output signal D6 in response to an input signal D6. However, as illustrated in FIG. 2 and discussed below, the stored value D5 is restored when the third IP block 115 is brought out of the power save mode. Following the activation or assertion of the retention control enable signal 212, the power domain enable control signal 210 is inactivated or de-asserted (e.g., to a logic low level) to control the power switch 114 into a non-conduction mode to remove the supply of power from the on-chip supply 106 to the third IP block 115. The low power mode phase 217 may last for as long as the third IP block 115 is not needed.

In preparation for restoring the state of the SoC 100 to a subsequent system active phase 218, the power save mode of the third IP block 115 is inactivated or de-asserted by reversing the order of the steps used to put the third IP block 115 into the power save mode. That is, the power domain enable control signal 210 is activated or asserted, which controls the power switch 114 into the conduction mode to provide the power (V4) from the on-chip supply 106 to the third IP block 115. The retention control enable signal 212 is inactivated or de-asserted, which restores the saved output value D5 to the output signal 216 of the low power flip-flop 121. Then, the isolation control signal 213 is inactivated or de-asserted. The subsequent system active phase 218 thus becomes operational, and the SoC 100 operates as prescribed.

Figure 3:
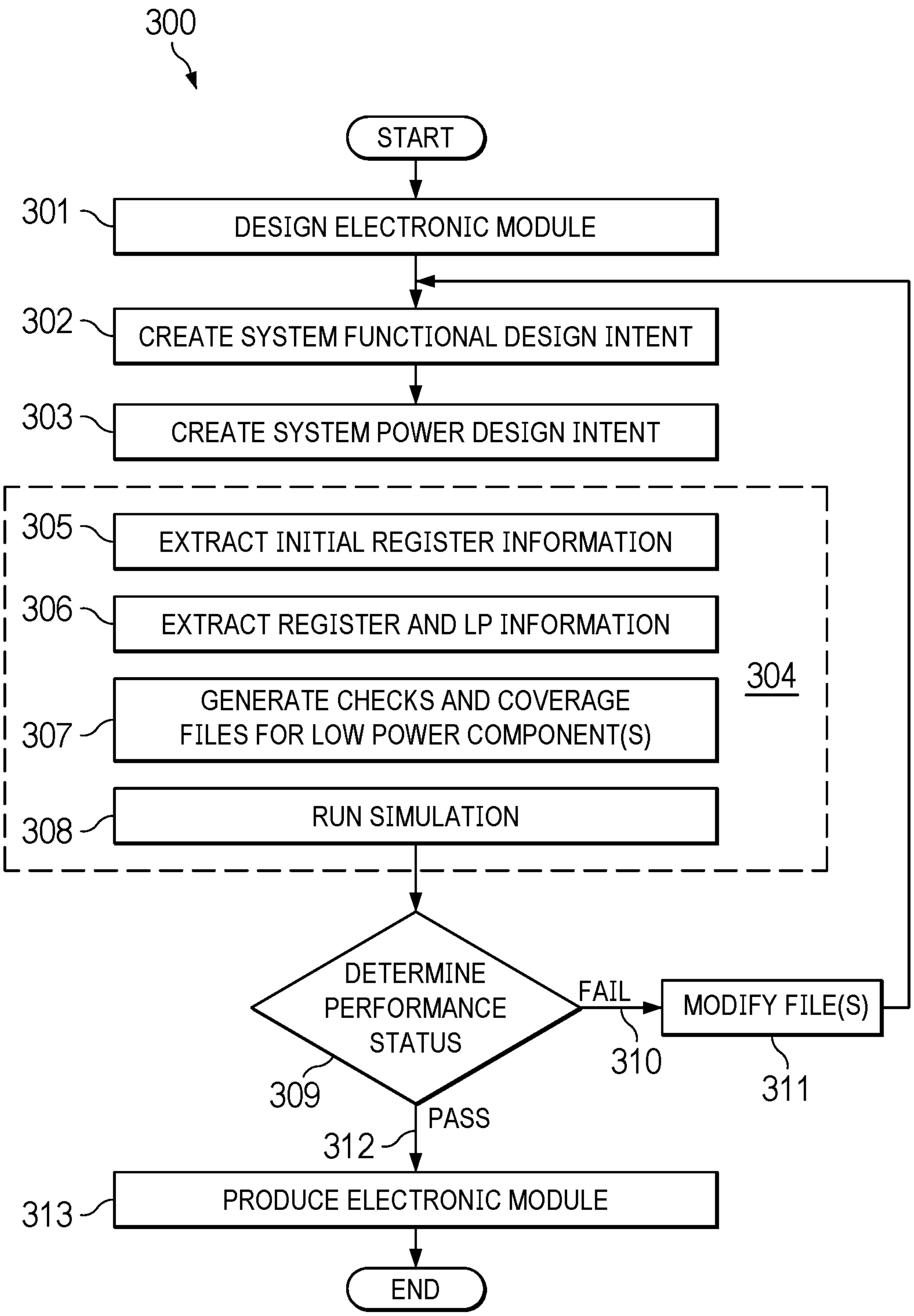
FIG. 3 is a flow diagram for designing and simulating chip functional behavior according to one or more disclosed implementations.

FIG. 3 illustrates a flow diagram of an operation 300 for designing, simulating, and manufacturing an SoC in accordance with one or more example implementations. Operation 300 generates a comprehensive coverage quantification methodology for mixed-signal aware, low power aspects like isolation, retention, and level shifting that includes all possible data states, all special sequence requirements associated with advanced retention functions (e.g., clock, reset conditions, preset conditions), different reset behaviours at cold power-up, and power-up from low power mode(s) under right power state(s) of related switched power domains.

Operation 300 begins with designing an electronic module or SoC at block 301. An example of designing the SoC is described below. Designing the SoC includes designing both the hardware and the software controlling the microcontroller, microprocessor or DSP cores, peripherals, interfaces, and other software components. Once the overall architecture of the SoC has been designed and defined, a system functional design intent is created in a file at block 302 that defines a model of the functional behavior, and optionally including that of standard low power components. In the system functional design intent file, individual hardware elements may be described in a design abstraction called RTL, which stands for register-transfer level. RTL is used to define the circuit behavior. Hardware elements are connected together in the RTL to create the full SoC design. In digital circuit design, RTL is a design abstraction which models a synchronous digital circuit in terms of the flow of digital signals (data) between hardware registers, and the logical operations performed on those signals. RTL abstraction is used in hardware description languages (HDLs) like Verilog and VHDL to create high-level representations of a circuit, from which lower-level representations and ultimately actual wiring can be inferred. The RTL exists in a system functional design intent file or multiple such files linked together upon compilation.

A system power design intent is created in a file at block 303. In the system power design intent file, power requirements for the low power cells or components in the SoC architecture design are defined using, for example, the common power format (CPF). Examples related to power intent herein are based on implementations including CPF for simplicity and are not meant to limit the disclosure thereto. Other formats such as the unified power format (UPF) may be alternatively used that yield similar results to the implementations described herein.

Figure 4:
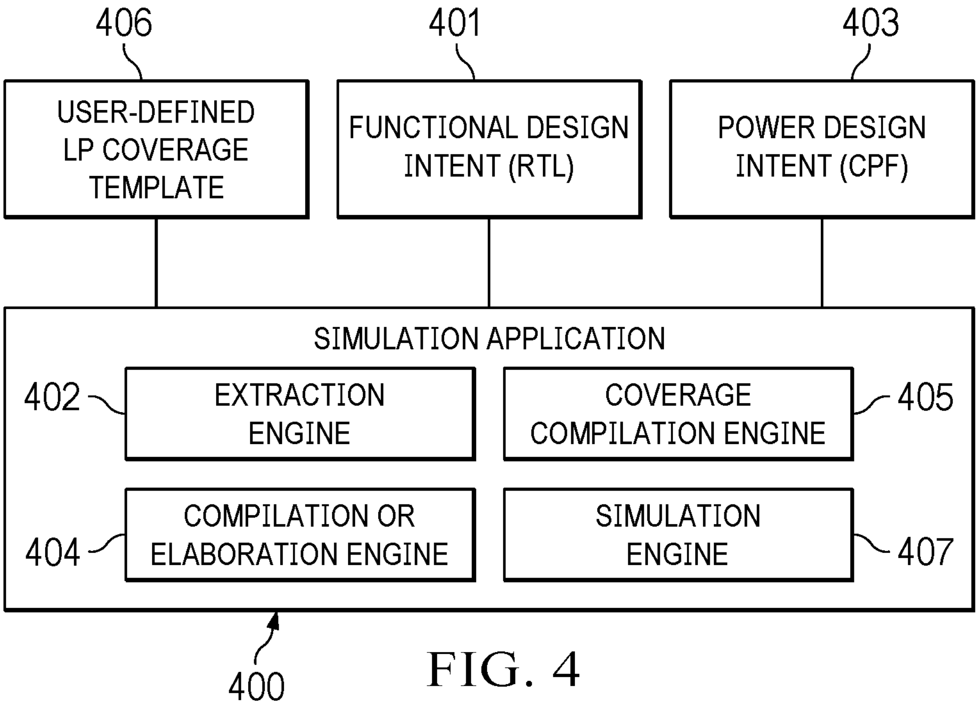
FIG. 4 is a block diagram of a simulation application according to one or more disclosed implementations.

A simulation 304 is performed based on the files created in blocks 302-303. Additional example details of simulations can be found in commonly assigned U.S. Patent Application Publication No. 2021/0255682, entitled "Boundary Port Power Intent Modelling and Management," filed on Jan. 25, 2021, and U.S. Pat. No. 11,574,099, entitled "Simulation Framework," filed on Aug. 3, 2021, each of which is incorporated by reference in its entirety. Referring to FIGS. 3 and 4, a simulation application or program 400 accesses a system functional design intent file 401 and extracts (block 305) initial register or sequential element information using an extraction engine 402. In an example, each register or sequential element from the functional design intent file 401 is extracted based on the following format:

REG_NAME|[L|F]|CLK_NAME|[P|N]|RST_NAME|
[H|L]|PRESET_NAME|[H|L]

In this format, information for each individual sequential element includes its name (REG_NAME), its type being either a latch or a flip-flop (L|F), its related clock (CLK_NAME), the active clock edge being either a positive (e.g., rising) edge or a negative (e.g., falling) edge (P|N), its related reset control signal name (RST_NAME), the reset control signal level being active high or low (H|L), its related preset control signal name (PRESET_NAME), and the preset control signal level being active high or low (H|L).

Due to the extraction engine 402 using the functional design intent file 401, which uses the RTL language, without also relying on power intent information, additional information including related retention and power domain information are not yet available since retention and power domain information are not contained in the RTL language. To retrieve the additional information, the simulation application 400 further access the functional design intent file 401 and a system power design intent file 403 using an elaboration engine 404 to generate log files that add additional information to the register or sequential element information including the related retention control enable signal name (RET_NAME), the active level of the retention control enable signal being high or low (H|L), and the related switched primary power domain (SW_PD_NAME) that is powering the core part of the sequential element. In this manner, the extracted information may be presented in the following format:

REG_NAME|[L|F]|CLK_NAME|[P|N]|RST_NAME|[H|L]|PRESET_NAME|[H|L]|RET_NAME|[H|L]|SW_PD_NAME

In addition to completing the extracted register or sequential element information using the additional retention and power domain information, the elaboration engine 404 also extracts (block 306) low power (LP) design information to capture isolation information, which includes an entry per signal that is getting isolated due to an underlying crossing between different power or voltage domains. The extracted LP design information may be presented in the following format:

SIG_NAME|ISO_NAME|[H|L]|[H|L|LATCH]|SW_PD_ NAME

In this format, each entry includes the signal name (SIG_NAME), its related isolation control signal (ISO_NAME), the level of the isolation control signal being active high or low (H|L), its isolation clamp type being high, low, or holding to the previous valid state (H|L|LATCH), and its related primary switched power domain (SW_PD_NAME). The extracted LP design information is combined with the extracted register information in the generated log files. While described in separate steps, the simulation application 400 may combine the extraction and elaboration engines 402, 404 into a single step for generating log files with the register and LP design information in the formats illustrated above or pass them as a metadata to subsequent simulation stage. Additionally, though not discussed, level shifting or more complex combined level shifting cum isolation requirements can be defined and derived automatically in similar formats as described above for isolation.

At block 307, the simulation application 400, using a coverage compilation engine 405 and accessing a user-defined LP coverage template 406 and the extracted register information and LP design information above, generates checks files and coverage files for low power components. The user-defined LP coverage template 406 defines rules for verifying coverage of low power components. The coverage compilation engine 405 attaches relevant LP coverage rules to the extracted components for providing checks and coverage information during simulation. Coverage information provides quantification for the coverage tests and identifies whether the relevant LP coverage rules pass or fail. Checks information provides localization as detailed information identifying how the LP coverage rules pass or fail. For example, checks information can identify a specific sequence instance inside the coverage test that causes the coverage test to pass or fail.

An example of a portion of the user-defined LP coverage template 406 related to LP register (e.g., low power flip-flop 121) coverage rules is represented by a pseudo code listing 500 shown in FIG. 5. The pseudo code represents a higher-language implementation of rules designed to comprehensively verify coverage of corresponding registers or sequential elements extracted from the functional and system power design intent files 401, 403 in the generated log files.

In a first portion 501 of the code 500, coverage for cold wake-up reset behavior (CW_RST) is determined. If the retention control enable signal (e.g., 212) is inactive and the reset control signal (e.g., 214) is active, the CW_RST coverage is set, and the correctness of the reset state is checked against an expected value.

In a second portion 502, if the retention control enable signal is active, then changes of the power domain enable control signal 210 from active to inactive and from inactive to active are tracked as well as a subsequent change of the retention control enable signal to the inactive state. If the power domain enable control signal 210 changed to inactive and to active between changes of the retention control enable signal to active and to inactive, RET coverage is set. In addition to verifying active and inactive states of the power domain enable control signal 210, the voltage level of the power domain itself (e.g., auxiliary voltage V4) may be tested to verify that the power domain is at an expected value in response to the power domain enable control signal 210 being active or inactive. For example, after a time delay in response to a change in the power domain enable control signal 210 being changed from the active state to the inactive state during the low power mode, the power domain signal may be verified to provide no power to the third IP block 115.

In third portion 503 of the pseudo code listing 500, if the retention control enable signal is active, then the output value Q (e.g., output signal 216) is stored. The changes of the power domain enable control signal 210 from active to inactive and from inactive to active are tracked as well as a subsequent change of the retention control enable signal to the inactive state. If the power domain enable control signal 210 changed to inactive and to active between changes of the retention control enable signal to active and to inactive and if the reset control signal is inactive when the retention control enable signal changes to inactive, the output value Q of the register is checked to verify an expected value. For example, for a zero test, if a zero value was stored prior to the change of the power domain enable control signal 210 from active to inactive and if a zero value is restored after the retention control enable signal changes to inactive, an LPM_RET0 coverage is set. Similarly, if a one value is stored and restored, an LPM_RET1 coverage is set. The pseudo code in FIG. 5 illustrates one example retention cell implementation. Alternatively, for the functionality of the retention cell represented by the waveforms in FIG. 2, the check for state restoration may be done just after the power domain enable control signal 210 changed from inactive to active.

In a fourth portion 504 of the pseudo code listing 500, if the retention control enable signal is active, then the output value Q (e.g., output signal 216) is stored. A subsequent change of the retention control enable signal from active to inactive is tracked. If the reset control signal is active when the retention control enable signal changes to inactive, a reset value of the register is verified at the output Q. If the expected reset value (e.g., zero value) is enforced as a result, the LPM_RST coverage is set.

Thus, the tested signals in each of the portions 501-504 are tested at various time points to ensure expected active or inactive states relative to one another.

An example of a portion of the user-defined LP coverage template 406 related to LP output component (e.g., output components 118, 119) coverage rules is represented by a pseudo code listing 600 shown in FIG. 6. The pseudo code represents a higher-language implementation of rules designed to comprehensively verify coverage of corresponding registers or sequential elements extracted from the functional and system power design intent files 401, 403 in the generated log files.

In a first portion 601 of the code 600, coverage for cold wake-up reset behavior (CW_RST) is determined. If the isolation control signal (e.g., 213) is inactive and the reset control signal (e.g., 214) is active, the CW_RST coverage is set, and the correctness of the reset state is checked against an expected value.

In a second portion 602, if the isolation control signal is active, then changes of the power domain enable control signal 210 from active to inactive and from inactive to active are tracked as well as a subsequent change of the isolation control signal to the inactive state. If the power domain enable control signal 210 changed to inactive and to active between changes of the isolation control signal to active and to inactive, ISO coverage is set.

In third portion 603 of the pseudo code listing 600, if the isolation control signal is active, then the output value Q (e.g., output signal 216) is stored for a latch type isolation cell. The changes of the power domain enable control signal 210 from active to inactive and from inactive to active are tracked as well as a subsequent change of the isolation control signal to the inactive state. If the power domain enable control signal 210 changed to inactive and to active between changes of the isolation control signal to active and to inactive and if the reset control signal is inactive when the isolation control signal changes to inactive, the output value Q of the register is checked to verify an expected value. For example, for a zero test, if a zero value was stored prior to the change of the power domain enable control signal 210 from active to inactive and if a zero value is restored after the isolation control signal changes to inactive, an LPM_ISO0 coverage is set. Similarly, if a one value is stored and restored, an LPM_ISO1 coverage is set.

In a fourth portion 604 of the pseudo code listing 600, if the isolation control signal is active, then the output value Q (e.g., output signal 216) is stored for a latch type isolation cell. A subsequent change of the isolation control signal from active to inactive is tracked. If the reset control signal is active when the isolation control signal changes to inactive, a reset value of the register is verified at the output Q. If the expected reset value (e.g., zero value) is enforced as a result, the LPM_RST coverage is set.

Thus, the tested signals in each of the portions 601-604 are tested at various time points to ensure expected active or inactive states relative to one another.

Though all prior coverage quantification and required state and sequence are validated based on a Boolean or logic abstraction of underlying control signals, all of these can also be related to an electrical or analog signal representing the control signals or the related power supply and ground signals checking for valid voltage levels and ranges. This is especially important in the context of digital mixed-signal co-simulation wherein analog and power supply and ground rails are modeled using real numbered modelling abstraction styles or electrical abstraction as in the case of analog mixed-signal co-simulation of underlying electronic components. This is especially important in case of power state qualification for RET, LPM_RET0, LPM_RET1, ISO. LPM_ISO0, LPM_ISO1, etc. coverage elements wherein the power sequence and state is qualified based on the supply level to reach valid levels as against the activation state of the control signal. This also helps validate the actual or approximate electrical behaviour than a more conservative logical model. This link between valid voltage levels, ranges and power states are inferred based on native features (like real number and electrical support for CPF power domain shutoff condition and UPF voltage conversion table (VCT)) available in the standard power intent languages (CPF or UPF).

Returning to FIGS. 3 and 4, simulation of the SoC 100 based at least in part on the functional design intent file 401, the system power design intent file 403, and the generated coverage and checks test files is run (block 308) by a simulation engine 407 to simulate operation of the SoC design. At block 309 of the operation 300, a performance status of the SoC may be determined based on the executed simulation. The SoC designer or other personnel may compare output of the simulation based on how the behavior and functionality were designed to work and determine whether the simulation represented operation of the SoC as expected. For example, the coverage tests may be reviewed to verify coverage values being set for each of the coverage tests run. A failure to set any one of the coverage tests indicates a failure in terms of insufficiency of the test scenarios. If the performance status indicates a failure 310, one or more of the simulation configuration files may be modified in response. For example, either of the functional design intent file 401 or the system power design intent file 403 may be modified at block 311 in response to re-designing the low power component in the SoC design. If the performance status indicates a pass or other satisfactory result 312, the SoC design may be manufactured to produce the designed SoC in physical form at block 313.

Figure 7:
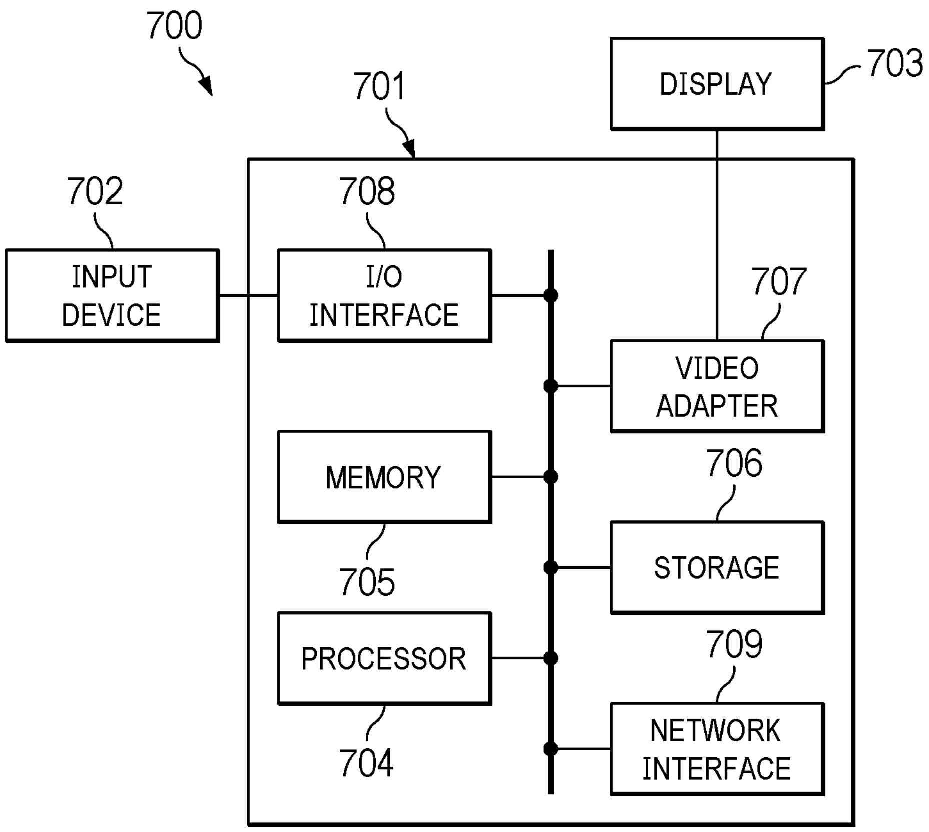
FIG. 7 is a block diagram of an example computer system that may be used to perform SoC simulation according to one or more disclosed implementations.

FIG. 7 is a block diagram of an example computer system 700 that may be used to perform chip design simulation as described herein. The computer system 700 includes a processing unit 701 coupled to one or more input devices 702 (e.g., a mouse, a keyboard, or the like), and one or more output devices, such as a display screen 703. The display screen 703 may be used to display progress of the simulation described herein to allow a user to monitor the operational performance of the simulation. In some embodiments, the display screen 703 may be touch screen, thus allowing the display screen 703 to also function as an input device. The processing unit 701 may be, for example, a desktop computer, a workstation, a laptop computer, a tablet, a dedicated unit customized for a particular application, a server, or the like. The display screen 703 may be any suitable visual display unit such as, for example, a computer monitor, an LED, LCD, or plasma display, a television, a high-definition television, or a combination thereof. The display screen 703 can be used, for example, to perform and display the simulation and display the performance status of the simulation such as that described herein.

The processing unit 701 includes a processor 704, memory 705, a storage device 706, a video adapter 707, and an I/O interface 708 connected by a bus. The bus may be one or more of any type of several bus architectures including a memory bus or memory controller, a peripheral bus, video bus, or the like. The processor 704 may be any type of electronic data processor. For example, the processor 704 may be a processor from Intel Corp., a processor from Advanced Micro Devices, Inc., a Reduced Instruction Set Computer (RISC), an Application-Specific Integrated Circuit (ASIC), or the like. The memory 705, e.g., a non-transitory computer-readable medium, can be any type of system memory such as static random-access memory (SRAM), dynamic random-access memory (DRAM), synchronous DRAM (SDRAM), read-only memory (ROM), a combination thereof, or the like. Further, the memory 705 can include ROM for use at boot-up, and DRAM for data storage for use while executing programs.

The storage device 706, e.g., a non-transitory computer-readable medium, can include any type of storage device configured to store data, programs, and other information and to make the data, programs, and other information accessible via the bus. In one or more embodiments, the storage device 706 stores software instructions to be executed by the processor 704 to perform embodiments of the methods described herein. The storage device 706 may be, for example, one or more of a hard disk drive, a magnetic disk drive, an optical disk drive, a solid-state drive, or the like.

The video adapter 707 and the I/O interface 708 provide interfaces to couple external input and output devices to the processing unit 701. The processing unit 701 also includes a network interface 709. The network interface 709 allows the processing unit 701 to communicate with remote units via a network (not shown). The network interface 709 may provide an interface for a wired link, such as an Ethernet cable or the like, or a wireless link. The computer system 700 may also include other components not specifically shown. For example, the computer system 700 may include power supplies, cables, a motherboard, removable storage media, cases, and the like.

While an SoC is primarily used throughout the above disclosure as an example type of chip, it will be appreciated that the techniques described herein may be applied in designing any type of IC chip. For instance, such IC chips may include a general-purpose or application-specific (ASIC) processor based upon x86, RISC, or other architectures, field-programmable gate array (FPGA), graphics processor (GPU), digital signal processor (DSP), a system-on-chip (SoC) processor, microcontroller, and/or related chip sets. By way of example only, the IC chip may be a model of a digital signal processor, an embedded processor, an SoC, or a microcontroller available from Texas Instruments Inc. of Dallas, Texas.

This disclosure has attributed functionality to processing unit 701 and processor 704. Processing unit 701 and processor 704 may include one or more processors. Processing unit 701 and processor 704 may include any combination of integrated circuitry, discrete logic circuitry, analog circuitry, such as one or more microprocessors, microcontrollers, digital signal processors, application specific integrated circuits, central processing units, graphics processing units, field-programmable gate arrays, and/or any other processing resources. In some examples, processing unit 701 and processor 704 may include multiple components, such as any combination of the processing resources listed above, as well as other discrete or integrated logic circuitry, and/or analog circuitry.

The techniques described in this disclosure may also be embodied or encoded in an article of manufacture including a non-transitory computer-readable storage medium, such as memory 705 and storage 706. Example non-transitory computer-readable storage media may include RAM, ROM, programmable ROM, erasable programmable ROM, electronically erasable programmable ROM, flash memory, a solid-state drive, a hard disk, magnetic media, optical media, or any other computer readable storage devices or tangible computer readable media. The term "non-transitory" may indicate that the storage medium is not embodied in a carrier wave or a propagated signal. In certain examples, a non-transitory storage medium may store data that can, over time, change (e.g., in RAM or cache).

The foregoing description of various preferred embodiments of the invention have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method comprising:

creating an electronic module design having a plurality of electronic components comprising a plurality of low power enabled components;

defining a model of functional behavior based on the electronic module design;

defining a model of power behavior based on the electronic module design;

identifying sequential element information correlated with an electronic component of the plurality of electronic components based on both of the model of functional behavior and the model of power behavior, the sequential element information comprising:

a first control signal; and a second control signal;

generating a coverage test based on the sequential element information, the coverage test configured to quantify behavior of the electronic component based on a relationship of a plurality of activation states of the first control signal to a plurality of activation states of the second control signal;

generating a simulation file based on the model of functional behavior, the model of power behavior, and the coverage test;

running the simulation file to simulate operation of the electronic module design; and determining a performance status of the electronic module design in response to running the simulation file.

2. The method of claim 1, further comprising configuring the coverage test to evaluate an activation state of the plurality of activation states of the first control signal and activation state of the plurality of activation states of the second control signal at one or more relative time points within the coverage test.

3. The method of claim 2,
wherein the first control signal comprises a power domain enable control signal; and
wherein the second control signal comprises a retention control enable signal.

4. The method of claim 3, wherein determining the performance status comprises determining the coverage test to be successful based on a state of the power domain enable control signal going into a deactivation state and into an activation state after activation of the retention control enable signal and before deactivation of the retention control enable signal.

5. The method of claim 3, wherein determining the performance status comprises determining the coverage test to be successful based on a successful restoration of a saved output value of the electronic component after deactivation of the retention control enable signal.

6. The method of claim 1, wherein the sequential element information further comprises a third signal.

7. The method of claim 6, wherein the third signal comprises a reset control signal; and
further comprising configuring the coverage test to verify behavior of the electronic component based on changing a state of the reset control signal into an unexpected state.

8. The method of claim 6, wherein the third signal comprises a power signal; and
further comprising configuring the coverage test to verify an expected state of power of the power signal during a target time point of the simulated operation.

9. The method of claim 8, wherein the target time point occurs after entry into a low power mode.

10. The method of claim 9, wherein the expected state comprises a loss of power supplied via the power signal.

11. A method comprising:
creating an electronic module design comprising a low power enabled component;
generating models of functional and power behavior based on the electronic module design;
identifying information correlated with the low power enabled component based on the models of functional and power behavior, the low power enabled component comprising:
a first signal input; and
a second signal input;
generating a coverage test based on the identified information, the coverage test configured to evaluate an activation state of a first control signal provided to the first signal input in relation to an activation state of a second control signal provided to the second signal input at one or more relative time points within the coverage test;
generating a simulation file based on the models of functional and power behavior and the coverage test;
running the simulation file to simulate operation of the electronic module design; and
determining a coverage status of the electronic module design in response to running the simulation file.

12. The method of claim 11, further comprising configuring the coverage test to quantify behavior of the low power enabled component based on a relationship of a first control signal provided to the first control signal to a second control signal provided to the second control signal.

13. The method of claim 12,
wherein the first control signal comprises a reset control signal; and
wherein the second control signal comprises a retention control enable signal.

14. The method of claim 13, wherein determining the coverage status comprises determining the coverage test to be successful based on a successful restoration of a saved output value of the low power enabled component after deactivation of the retention control enable signal and based on the reset control signal being inactive when the retention control enable signal is deactivated.

15. The method of claim 13, wherein determining the coverage status comprises determining the coverage test to be successful based on a reset value being output by the low power enabled component after deactivation of the retention control enable signal and based on the reset control signal being active when the retention control enable signal is deactivated.

16. The method of claim 11, further comprising:
identifying isolation information correlated with an isolation element based on the models of functional and power behavior;
generating the coverage test further based on the identified isolation information; and
configuring the coverage test to evaluate an activation state of the isolation element in relation to an activation state of one of a power domain activation state and a reset control activation state.

17. The method of claim 16, wherein the first control signal comprises an isolation control enable signal;
wherein the isolation information comprises a power domain signal; and
wherein determining the coverage status comprises determining the coverage test to be successful based on a state of the power domain signal going into a deactivation state and into an activation state after activation of the isolation control enable signal and before deactivation of the isolation control enable signal.

18. The method of claim 16, wherein the isolation element comprises a latch type isolation element.

19. The method of claim 18, wherein determining the coverage status comprises determining the coverage test to be successful based on a successful restoration of a saved value of the latch type isolation element after deactivation of the reset control activation state.

20. The method of claim 11, wherein generating the coverage test comprises accessing a user-defined coverage template defining a functional behavior of the low power enabled component.

* * * * *